United States Patent
Kasperkovitz

(10) Patent No.: US 6,993,305 B2
(45) Date of Patent: Jan. 31, 2006

(54) AM RECEIVER WITH AUDIO FILTERING MEANS

(76) Inventor: Wolfdietrich Georg Kasperkovitz, Eikenlaan 4, NL-5581 HA, Waalre (NL)

( * ) Notice: Subject to any disclaimer, the term of this patent is extended or adjusted under 35 U.S.C. 154(b) by 450 days.

(21) Appl. No.: 10/433,715

(22) PCT Filed: Nov. 14, 2001

(86) PCT No.: PCT/EP01/13395

§ 371 (c)(1),
(2), (4) Date: Jun. 4, 2003

(87) PCT Pub. No.: WO02/47260

PCT Pub. Date: Jun. 13, 2002

(65) Prior Publication Data

US 2004/0043729 A1    Mar. 4, 2004

(30) Foreign Application Priority Data

Dec. 5, 2000   (EP) ................................. 00204339

(51) Int. Cl.
*H04B 1/06* (2006.01)
*H04B 7/00* (2006.01)

(52) U.S. Cl. ................... 455/232.1; 455/234.1; 455/239.1; 455/250.1; 375/345

(58) Field of Classification Search .......... 455/232.1, 455/234.1, 235.1, 239.1, 240.1, 250.1, 251.1, 455/234.2; 375/345
See application file for complete search history.

(56) References Cited

U.S. PATENT DOCUMENTS

| | | | |
|---|---|---|---|
| 4,105,976 A | | 8/1978 | Floyd |
| 4,893,347 A | | 1/1990 | Eastmond et al. |
| 5,220,686 A | * | 6/1993 | Kasperkovitz et al. ... 455/234.1 |
| 5,691,666 A | * | 11/1997 | Owen ......................... 329/319 |
| 5,715,529 A | * | 2/1998 | Kianush et al. ............. 455/266 |
| 5,758,274 A | * | 5/1998 | Vu et al. ................. 455/246.1 |
| 5,761,251 A | * | 6/1998 | Wender ...................... 375/345 |
| 6,032,031 A | * | 2/2000 | Takaki ...................... 455/245.2 |
| 6,498,926 B1 | * | 12/2002 | Ciccarelli et al. ........ 455/240.1 |
| 6,771,719 B1 | * | 8/2004 | Koyama et al. ............ 375/345 |

FOREIGN PATENT DOCUMENTS

| JP | 55 050746 A | 4/1980 |
|---|---|---|
| JP | 07 321754 | 12/1995 |

* cited by examiner

*Primary Examiner*—Simon Nguyen
(74) *Attorney, Agent, or Firm*—R. M. McDermott, Esq.

(57) ABSTRACT

An AM receiver includes an audio filter that is configured to selectively narrow the audio bandwidth of the demodulated signal when a signal with a low signal-to-noise ratio is received. By suitably bandpass-filtering the signal, for example, to 200–5000 Hertz, the intelligibility of the demodulated audio signal is not substantially reduced, whereas this bandpass-filtering substantially suppresses the audio noise that is typically found to be most annoying when listening to an full-bandwidth audio signal with a low signal-to-noise ratio. Optionally, the audio filter also provides gain to the bandpass-filtered signal.

26 Claims, 2 Drawing Sheets

AM RECEIVER WITH AUDIO FILTERING MEANS

Figure 1:
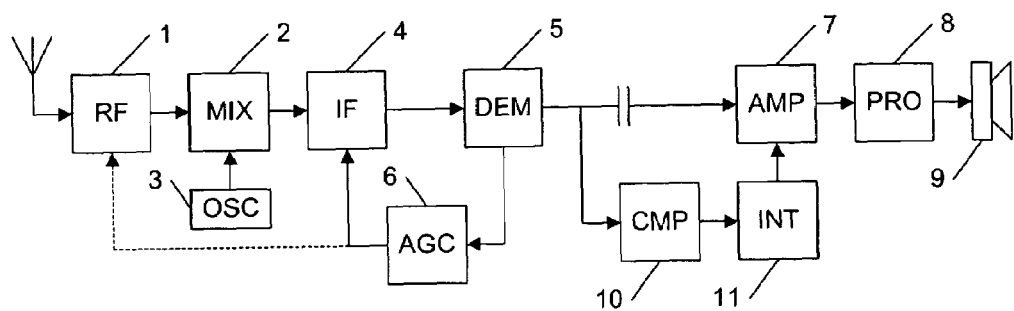

The invention relates to an AM receiver comprising an RF input circuit for receiving an RF AM signal, demodulation means providing an audio signal carried by said RF AM signal as well as first automatic gain control (AGC) means for stabilizing an RF carrier dependent DC level at an output of said demodulation means within a first range of field-strength values of said RF AM signal at a substantially fixed stabilization value. Such receivers are widely known e.g. from Philips' Application Note of Philips' one chip AM radio IC TEA 5551T dated October 1990.

In demodulating the baseband audio modulation signal the demodulation means of said known receivers also rectify the RF AM carrier signal into a DC level. Being a reference for the fieldstrength of the received RF AM signal—or RF reception fieldstrength—this DC level is used in said first AGC means to stabilize the amplitude of the demodulated audiosignal against variations in the RF reception fieldstrength. The first AGC means therefore increases the receiver gain at a decrease of the actual DC level from said fixed stabilization level and vice versa, such that said DC level is being stabilised at said fixed stabilization level. This automatic receiver gain control is effective within the gain control range of the first AGC means—hereinafter also being referred to as first AGC range—, which defines said first range of RF reception fieldstrength values. Within this range, the noise level of the RF AM signal increases as the fieldstrength decreases. In particular, values of the RF reception fieldstrength decreasing below said first range of RF reception fieldstrength vales cause sharp reduction of the signal to noise ratio to occur. To avoid noise from becoming unacceptably aggressive, the overall gain of the known receiver is controlled to let the above DC level at the output of the demodulation decrease from said stabilization level as the RF reception fieldstrength further decreases. This, however, also reduces the amplitude of the useful audiosignal and therewith the intelligibility thereof.

It is an object of the invention to increase the signal to noise ratio and the intelligibility of the audiosignal in an AM receiver in particular for values of the RF signal reception fieldstrength below said first AGC range.

An AM receiver comprising an RF input circuit for receiving an RF AM signal, demodulation means providing an audio signal carried by said RF AM signal as well as first automatic gain control means for stabilizing an RF carrier dependent DC level at the output of said demodulation means within a first range of fieldstrength values of said RF AM signal at a substantially fixed stabilization value, according to the invention is therefore characterised by audio filtering means included in an audio signal path following the demodulation means for a variable pass band selection of the audio signal and being controlled by control means being supplied with said DC level to decrease the bandwidth of the audio filtering means at a decrease of said DC level below said stabilization value.

The invention is based on the recognition that narrowing the bandwidth of the audio signal to be reproduced does not necessarily reduce the intelligibility of the audio signal. The measure according to the invention allows to effectively suppress highly annoying noise distortions, while maintaining the intelligibility of the perceived audiosignal also for fieldstrength values below the first range of fieldstrength values of said RF AM signal.

Preferably, the audio filtering means provides a pass band filter characteristic, which is logarithmic symmetrical around a center frequency of substantially 1 kHz.

This measure is based on the recognition, that the noise level of the audio signal components the passband of the audio filtering means does not effect the intelligibility thereof to the same extend as the noise level of the audio signal components beyond this frequency range. By applying this measure the logarithmic symmetrical filter characteristic avoids unacceptable transient effects to occur when varying the bandwidth of the audio signal to be reproduced.

In a further preferred embodiment of an AM receiver according to the invention, the audio filtering means is provided with a high pass cut off frequency of at least in the order of magnitude of 200 Hz and a low pass cut off frequency of at most in the order of magnitude of 5 kHz.

Another preferred embodiment of an AM receiver according to the invention, is characterised by said control means being included in second automatic gain control means and controlling audio amplifying means included in said audio signal path to increase the gain thereof at a decrease of said DC level below said stabilization value. This measure is based on the recognition that the improvement in signal to noise ratio obtained by narrowing the passband selection of the audio signal at decreasing RF reception fieldstrength, allows to continue increasing the overall receiver gain even below said first AGC range. By applying this measure, the intelligibility of the selectively amplified audio signal is further increased while avoiding noise distortions from becoming unacceptably aggressive.

The second automatic gain control means may comprise a feed forward control loop including said control means coupled between an output of the demodulator means and a control input of said audio amplifying means.

Alternatively, the second automatic gain control means may comprise a feed back control loop including said control means coupled between an output of the audio amplifying means and a control input of said audio amplifying means.

In another preferred embodiment of an AM receiver according to the invention, said audio filtering means and said audio amplifying means are being combined into selective audio amplifier means being controlled to increase in both gain and selectivity at a decrease of said DC level below said stabilization value. This measure allows to control both gain and selectivity of said means with a single control signal being derived from the DC signal level of the demodulated audio signal, which is usually present in most conventional AM receivers. This allows to apply the invention in an add on box which can be simply connected to an output of the demodulation means of such conventional AM receivers.

To allow for a simple IC implementation, the selective audio amplifying means preferably comprise in an audio signal path a first transconductance amplifier followed by a massconnected parallel RC filter, a second transconductance amplifier having an input and an output connected to the parallel RC filter, the gain thereof being controlled through the control terminal of the selective audio amplifying means. By varying the gain of said second transconductance amplifier, both gain and selectivity of the selective audio amplifying means are varied in accordance with the invention.

For a reliable setting of the AGC range of the second automatic gain control means, the control means are provided with comparator means for comparing the RF carrier dependent DC level with the fixed stabilization value DC level, followed by an integrator.

To further simplify IC implementation, the control means are provided with said comparator means, supplying an output current to an integrating capacitance at a decrease of said DC level below said stabilization value. This measure allows repetitive use of the same transconductance amplifier structure at various places within the receiver, therewith increasing the receiver reliability and robustness.

The invention will be described in greater detail with reference to the Figures shown in the drawing, in which corresponding elements have the same references, which Figures only serve to illustrate the description.

Figure 2:
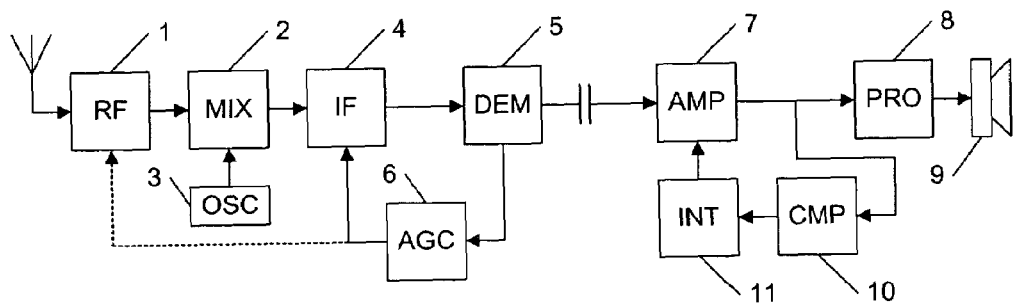
Figure 3:
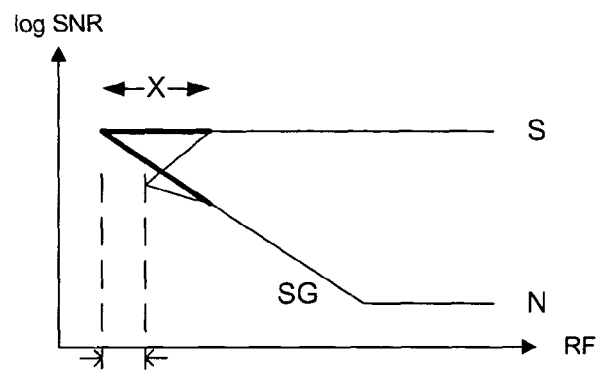
Figure 4:
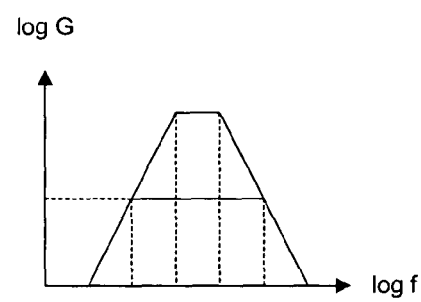
Figure 5:
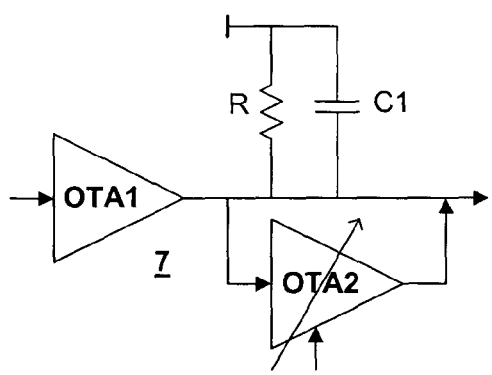
Figure 6:
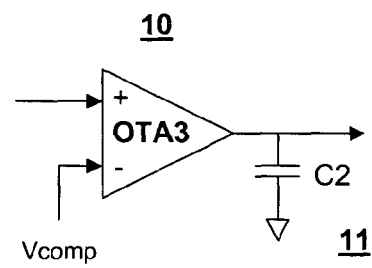

Herein, it is shown in:

FIG. 1, a first embodiment of an AM receiver according to the invention;

FIG. 2, a second embodiment of an AM receiver according to the invention;

FIG. 3, a signal plot showing the signal to noise ratio of the demodulated audiosignal of the AM receiver of FIGS. 1 and 2 as a function of the RF reception fieldstrength;

FIG. 4, a signal plot showing the bandwidth and gain variation of the selective audio amplifying means of the first and second embodiment of FIGS. 1 and 2, due to a variation of the fieldstrength below the first AGC range;

FIG. 5, a blockdiagram of the selective audio amplifying means as used in the AM receiver of FIG. 1;

FIG. 6, a blockdiagram of the control means of the AM receiver of FIG. 1;

FIG. 1 shows a first embodiment of an AM receiver according to the invention comprising consecutively coupled to antenna means ANT, an RF input circuit 1 for receiving an RF AM signal, an RF mixer stage 2 being provided with a local oscillator signal from a tuning oscillator 3 for converting said RF AM signal into an intermediate frequency (IF) AM signal, an IF unit 4 for a selective amplification of said IF AM signal, demodulation means 5 for demodulating said IF AM signal into an an audio signal and for rectifying the IF carrier into a DC level. Variations in the magnitude of the carrier of the RF AM signal (RF carrier) are reflected in the IF carrier and therewith in said DC level. The DC level, in representing a reliable indication for the RF reception fieldstrength, is being used in said first AGC means as a reference signal to stabilize the amplitude of the demodulated audiosignal against variations in the RF reception fieldstrength. The DC level is therefore coupled from a DC level output of the demodulating means 5 to first automatic gain control (AGC) means 6, which derives a suitable gain control signal from the DC level. This gain control signal is provided to a gain control input of the IF unit 4 and eventually also to a gain control input of the RF input circuit 1, such that any deviation of the DC level from a predetermined fixed stabilization level is negatively fed back to the IF unit 4 and eventually to the RF input circuit 1 as well. Any decrease of the DC level below a predetermined fixed stabilization level therewith causes the gain in the receiver signal path to increase and vice versa. This results in the DC level at the DC level output of the demodulating means 5 being stabilised substantially at said fixed stabilization value. This automatic gain control is effective for variations in the RF reception fieldstrength within a certain range ("first RF reception fieldstrength range"), which is defined by the gain control range of the first AGC means 6 ("first AGC range"). However, as shown with curve N in FIG. 3, a decrease of the RF reception fieldstrength causes the noise level to increase already for values of the RF reception fieldstrength within said first range. Within this range, the signal level remains constant as is shown in this FIG. 3 with line S. This means that with a decrease in the RF reception fieldstrength causes the signal to noise ratio of the audio signal to reduce. In particular for values of the RF reception fieldstrength decreasing below said first RF reception fieldstrength range, the signal to noise ratio of the audio signal strongly decreases with decreasing fieldstrength. The first AGC means 6 then runs out of its gain control range and stops compensating the decrease in DC level at the output of the demodulation means 5 to the full. As a result thereof the DC level decreases with regard to the above fixed stabilization level and along therewith also the amplitude of the audio signal, i.e. both signal and noise level thereof. This may soften to some extent the noise impression, but the decrease in signal level strongly reduces the intelligibility of the audio signal. The part of the AM receiver described sofar is as such known, e.g. from Philips' Application Note on Philips' one chip AM radio IC TEA 5551T dated October 1990.

According to the invention, the demodulating means 5 supplies the demodulated audio signal including a DC component corresponding to the above DC level from an output to control means 10, 11 and through a DC blocking capacitor C for blocking said DC component to selective audio amplifier means 7. The selective audio amplifier means 7 is functioning as both audio filtering means and amplification means and is included in an audio signal path following the demodulation means 5. The selective audio amplifier means 7 receives the audio signal without DC component to filter and amplify the same in accordance with the invention. An output of the selective audio amplifier means 7 is coupled to an audio sign processor 8 to further process the audio signal and eventually adapt the audio characteristic to the user's preference followed by a loudspeaker unit 9. The control means 10, 11 functions as second automatic gain control means and is included in a feed forward control loop coupled between the latter output of the demodulator means 5 and a control input of said audio amplifying means 7. The control means 10, 11 derives a control signal from the DC component of the audio signal, which is supplied to said control terminal of the selective audio amplifier means 7. With this control signal, the control means 10, 11 is controlled to increase the selective audio amplifier means 7 in both gain and selectivity as soon as the DC level decreases below the stabilization level, i.e. as soon as the RF reception fieldstrength decreases below the first RF reception fieldstrength range.

The selectivity increase is obtained in that the audio amplifier means 7 provides a passband selection of the audio signal supplied to it, the bandwidth thereof being controlled by the control means 10, 11 to narrow at said DC level decrease. Therein an optimum trade off between the perceptual signal to noise ratio and audio bandwidth of the demodulated audiosignal is being strived at. Preferably, the audio filtering means AF are bandwidth controlled to effect a passband varying substantially symmetrically on a logarithmic scale around a center frequency of substantially 1 kHz within a bandwidth control range substantially between 500 Hz and 5 kHz.

The improvement in the perceptual signal to noise ratio of the audio signal due to the above bandwidth reduction allows to increase the overall receiver gain while keeping the noise in the audio signal within acceptable limits. This is obtained by increasing the gain of the selective audio amplifier means 7, preferably such that the overall receiver gain, i.e. the receiver gain including the gain of the selective amplifier means 7 is sufficiently large to maintain the amplitude of the audio signal at the output of the selective amplifier means at the above stabilization level. The effect thereof on the signal and noise level of the audio being shown in bold lines extending respective curves S and N in FIG. 3 below the first AGC range. The distance between the bold extensions of curves S and N is a measure for the signal to noise ratio of the audio signal and it is clear from FIG. 3 that the invention not only improves the signal to noise ratio of the audio signal at values of the RF reception fieldstrength below the first RF reception fieldstrength range, but also extends the range, in which the amplitude of the audio signal is stabilised, starting now at much lower values of the RF reception fieldstrength than possible with the first AGC means only. This applies to the range of RF reception fieldstrength values indicated in FIG. 3 with X. As a result of the above extension of the stabilization range, the receiver is able to receive and reproduce much weaker RF reception signals than the conventional receiver. The extra range of RF reception fieldstrength obtained with the invention is indicated a FIG. 3 With SG.

FIG. 2 shows a second embodiment of an AM receiver according to the invention, in which corresponding elements are indicated with same reference numerals. This second embodiment differs from the first embodiment of FIG. 1, in that said control means 10, 11 functioning as the second automatic gain control means are included in a feed back control loop coupled between an output of the audio amplifying means 7 and a control input of the same. In this second embodiment the DC component of the audio signal at the above output of the demodulation means 5 is to be supplied through the audio amplifying means 7 to the input of the control means 10, 11. This means that the DC blocking capacitance C is to be included in the signal path between the audio amplifying means 7 and the audio signal processor 8, outside the feed back control loop of the second automatic gain control means. As in the fist embodiment, also in this second embodiment the control means 10, 11 derive from said DC component a control signal for the audio amplifying means 7 to increase the selectivity and gain thereof as soon as the DC level now detected at the output of the audio amplifying means 7 decreases below the stabilization level, i.e. as soon as the RF reception fieldstrength decreases below the first RF reception fieldstrength range. And also here, the increase in the gain of the selective audio amplifier means 7 at a decrease in RF reception fieldstrength is chosen preferably such that the overall receiver gain, i.e. the receiver gain including the gain of the selective amplifier means 7 is sufficiently large to maintain the amplitude of the audio signal at the output of the selective amplifying means at the above stabilization level.

FIG. 4 is a signal plot showing the bandwidth and gain characteristic of the selective audio amplifying means 7 of the first and second embodiment of FIGS. 1 and 2. In its audio filtering function, the selective audio amplifying means 7 provides a pass band filter characteristic, which is logarithmic symmetrical around a center frequency of substantially 1 kHz. Preferably, the pass band filter characteristic is chosen to have a high pass cut off frequency of at least in the order of magnitude of 200 Hz and a low pass cut off frequency of at most in the order of magnitude of 5 kHz. The bandwidth and gain characteristic of the selective audio amplifying means 7 is effective as from the first deviation of the DC level from the stabilization level, i.e. below the first AGC range or at a value of the RF reception fieldstrength just below the first RF reception fieldstrength range. The greater this deviation, the greater the gain factor and the smaller the bandwidth of the selective audio amplifying means 7. By way of example: an increase in the logarithmic value of the gain (log G) by a factor 3 causes an high pass cut off frequency of 200 Hz and a low pass cut off frequency of 5 kHz to increase, respectively decrease, to 600 Hz, respectively 1.67 kHz.

FIG. 5 is a blockdiagram of the selective audio amplifying means 7 as used in the first and second embodiments of FIGS. 1 and 2, combining the functions of audio filtering means and audio amplifying means. The selective audio amplifying means 7 comprises in an audio signal path a first transconductance amplifier OTA1 followed by a massconnected parallel RC filter, which comprises a resistance R across capacitance C1, a second transconductance amplifier OTA2 negatively fed back from an output to an input, the common connection of said input and output being connected to the parallel RC filter. The gain of the second transconductance amplifier OTA2 is controlled by the control means 10, 11 through the control terminal of the selective audio amplifying means 7.

The second transconductance amplifier OTA2 provides a negative resistance across the resistance R, varying with the gain thereof. An increasing gain of the second transconductance amplifier OTA2 causes the effective parallel resistance across capacitance C1 to increase, directly resulting in a reduction of the bandwidth of the selective audio amplifying means 7. Such increase in the gain of the second transconductance amplifier OTA2 also causes the negative feedback for low frequencies to increase as well, therewith extending signal compensation to higher frequency values. This results in an increase of the high pass cut off frequency of the transfer characteristic of the selective audio amplifying means 7.

FIG. 6 is a blockdiagram of the control means 10, 11 comprising a third transconductance amplifier OTA3 having an output coupled through a massconnected integrating capacitance C2. In the first embodiment of the AM receiver as shown in FIG. 1, the control means 10, 11 is included in a feedforward loop from the demodulator means 5 to the control input of the selective audio amplifying means 7. In the second embodiment of the AM receiver as shown in FIG. 2, the control means 10, 11 is included in a feedback loop from the output of the selective audio amplifying means 7 to the control input of thereof. The third transconductance amplifier OTA3 is provided with comparison means for activating the third transconductance amplifier OTA3 to supply an output current to the integrating capacitance C2, when the voltage signal, i.e. the DC level, decreases below a threshold level Vcomp, which corresponds to the above stabilization level. The person skilled in the art will recognize alternative embodiments within the ambit of the present invention, the scope of which has justfully been determined by the appended claims hereinafter. For example, the receiver may well be based on a direct receiving concept, the selective audio amplifier means 7 may well be implemented with a cascade of an audio filter and a controllable amplifier, the RF fieldstrength indicative signal may be derived directly from the RF signal level, the AGC may be effective on the RF input circuit as well.

What is claimed is:

1. An AM receiver comprising:
   an RF input circuit for receiving an RF AM signal,
   a demodulator providing an audio signal carried by said RF AM signal,
   a first automatic gain control that is configured to stabilize an RF carrier dependent DC level at the output of the demodulator within a first range of fieldstrength values of said RF AM signal at a substantially fixed stabilization value, and an audio filter included in an audio signal path following the demodulator for a variable pass band selection of the audio signal, the audio filter being controlled by control means being supplied with said DC level to decrease the bandwidth of the audio filtering means at a decrease of said DC level below said stabilization value.

2. The AM receiver according to claim 1, wherein the audio filter provides a pass band filter characteristic, which is logarithmic symmetrical around a center frequency of substantially 1 kHz.

3. The AM receiver according to claim 2, wherein the audio filter includes a high pass cut off frequency of at least in the order of magnitude of 200 Hz and a low pass cut off frequency of at most in the order of magnitude of 5 kHz.

4. The AM receiver according to claim 3, further including a second automatic gain control that includes said control means, and an audio amplifier that is included in said audio signal path, wherein the second automatic gain control is configured to increase the gain of the audio amplifier at a decrease of said DC level below said stabilization value.

5. The AM receiver according to claim 2, further including a second automatic gain control that includes said control means, and an audio amplifier that is included in said audio signal path, wherein the second automatic gain control is configured to increase the gain of the audio amplifier at a decrease of said DC level below said stabilization value.

6. The AM receiver according to claim 1, further including a second automatic gain control that includes said control means, and an audio amplifier that is included in said audio signal path, wherein the second automatic gain control is configured to increase the gain of the audio amplifier at a decrease of said DC level below said stabilization value.

7. The AM receiver according to claim 6, wherein said audio filter and said audio amplifier being combined into a selective audio amplifier that is controlled to increase both gain and selectivity at a decrease of said DC level below said stabilization value.

8. The AM receiver according to claim 7, wherein the selective audio amplifier comprises:

a first transconductance amplifier followed by a massconnected parallel RC filter, and a second transconductance amplifier having an input and an output connected to the parallel RC filter, the gain of the second transconductance amplifier being controlled by a control signal supplied by the control means.

9. The AM receiver according to claim 8, wherein the second automatic gain control comprises a feed forward control loop including said control means coupled between an output of the demodulator and a control input of said audio amplifier.

10. The AM receiver according to claim 8, wherein the second automatic gain control comprises a feed back control loop including said control means coupled between an output of the audio amplifier and a control input of said audio amplifier.

11. The AM receiver according to claim 8, wherein the control means includes a comparator for comparing the RF carrier dependent DC level with the fixed stabilization value, followed by an integrator.

12. The AM receiver according to claim 11, wherein the comparator includes a third transconductance amplifier that is configured to provide an output current to an integrating capacitance at a decrease of said DC level below said stabilization value.

13. The AM receiver according to claim 7, wherein the second automatic gain control comprises a feed forward control loop including said control means coupled between an output of the demodulator and a control input of said audio amplifier.

14. The AM receiver according to claim 7, wherein the second automatic gain control comprises a feed back control loop including said control means coupled between an output of the audio amplifier and a control input of said audio amplifier.

15. The AM receiver according to claim 7, wherein the control means includes a comparator for comparing the RF carrier dependent DC level with the fixed stabilization value, followed by an integrator.

16. The AM receiver according to claim 15, wherein the comparator includes a transconductance amplifier that is configured to provide an output current to an integrating capacitance at a decrease of said DC level below said stabilization value.

17. The AM receiver according to claim 6, wherein the second automatic gain control comprises a feed forward control loop including said control means coupled between an output of the demodulator and a control input of said audio amplifier.

18. The AM receiver according to claim 17, wherein the control means includes a comparator for comparing the RF carrier dependent DC level with the fixed stabilization value, followed by an integrator.

19. The AM receiver according to claim 18, wherein the comparator includes a transconductance amplifier that is configured to provide an output current to an integrating capacitance at a decrease of said DC level below said stabilization value.

20. The AM receiver according to claim 6, wherein the second automatic gain control comprises a feed back control loop including said control means coupled between an output of the audio amplifier and a control input of said audio amplifier.

21. The AM receiver according to claim 20, wherein the control means includes a comparator for comparing the RF carrier dependent DC level with the fixed stabilization value, followed by an integrator.

22. The AM receiver according to claim 21, wherein the comparator includes a transconductance amplifier that is configured to provide an output current to an integrating capacitance at a decrease of said DC level below said stabilization value.

23. The AM receiver according to claim 6, wherein the control means includes
   a comparator for comparing the RF carrier dependent DC level with the fixed stabilization value, followed by
an integrator.

24. The AM receiver according to claim 23, wherein the comparator includes a transconductance amplifier that is configured to provide an output current to an integrating capacitance at a decrease of said DC level below said stabilization value.

25. The AM receiver according to claim 1, wherein the control means includes
   a comparator for comparing the RF carrier dependent DC level with the fixed stabilization value, followed by
   an integrator.

26. The AM receiver according to claim 25, wherein the comparator includes a transconductance amplifier that is configured to provide an output current to an integrating capacitance at a decrease of said DC level below said stabilization value.

* * * * *